United States Patent [19]
Steenblik et al.

[11] Patent Number: 5,568,313
[45] Date of Patent: *Oct. 22, 1996

[54] APPARATUS FOR PROVIDING AUTOSTEREOSCOPIC AND DYNAMIC IMAGES AND METHOD OF MANUFACTURING SAME

[75] Inventors: Richard A. Steenblik, Atlanta; Mark J. Hurt, Alpharetta, both of Ga.

[73] Assignee: Applied Physics Research, L.P., Roswell, Ga.

[ * ] Notice: The term of this patent shall not extend beyond the expiration date of Pat. No. 5,359,454.

[21] Appl. No.: 205,047

[22] Filed: Mar. 2, 1994

Related U.S. Application Data

[63] Continuation-in-part of PCT/US93/07784, Aug. 17, 1983, which is a continuation-in-part of Ser. No. 931,871, Aug. 18, 1992, Pat. No. 5,359,454.

[51] Int. Cl.⁶ .......................... G02B 27/22; G02B 27/12
[52] U.S. Cl. ................................. 359/463; 359/619
[58] Field of Search ...................... 359/462, 463, 359/464, 469, 619; 355/22

[56] References Cited

U.S. PATENT DOCUMENTS

| | | |
|---|---|---|
| 1,260,682 | 3/1918 | Kanolt . |
| 1,918,705 | 7/1933 | Ives ............................ 359/463 |
| 3,161,509 | 12/1964 | Howe et al. ................. 359/463 |
| 3,306,974 | 2/1967 | Cunnally ..................... 178/5.2 |
| 3,357,770 | 12/1967 | Clay ............................ 359/463 |
| 3,365,350 | 1/1968 | Cahn ........................... 359/463 |
| 3,459,111 | 8/1969 | Cooper, Jr. .................. 359/463 |
| 3,607,273 | 9/1971 | Kinney . |
| 3,706,486 | 12/1972 | de Montebello ............ 359/619 |
| 3,953,869 | 4/1976 | Lo et al. ...................... 354/115 |
| 4,120,562 | 10/1978 | Lo et al. ...................... 350/130 |
| 4,158,501 | 6/1979 | Smith et al. ................. 355/77 |
| 4,468,115 | 8/1984 | Lao ............................. 355/22 |
| 4,596,458 | 6/1986 | Gundlach .................... 355/22 |
| 4,600,297 | 7/1986 | Winnek ....................... 355/22 |
| 4,667,092 | 5/1987 | Ishihara ....................... 359/619 |
| 4,674,853 | 6/1987 | Street .......................... 354/112 |
| 4,853,769 | 8/1989 | Kollin ......................... 358/88 |
| 4,903,069 | 2/1990 | Lam ............................ 355/22 |
| 4,920,039 | 3/1990 | Fotland et al. .............. 430/324 |
| 5,113,213 | 5/1992 | Sandor et al. ............... 355/22 |
| 5,132,839 | 7/1992 | Travis ......................... 359/463 |
| 5,359,454 | 10/1994 | Steenblik ..................... 359/463 |

OTHER PUBLICATIONS

Takanori Okoshi, Three–Dimensional Imaging Techniques, 1976, New York, pp. 13–28 and 366–368.
Herbert E. Ives, The Chromolinoscope Revived, Jun. 1930, New York, pp. 345–347.

*Primary Examiner*—Paul M. Dzierzynski
*Assistant Examiner*—Audrey Chang
*Attorney, Agent, or Firm*—Deveau, Colton & Marquis

[57] ABSTRACT

A light control material having a layer of emulsion, an inner optic, and a substrate. Image strips are formed in the emulsion. The inner optic provides illumination of the image strips as well as the light direction control needed to produce the perception of autostereoscopic depth, motion, or color change. The inner optic is comprised of a pattern of bright zones and dark zones. The inner optic has a constant period and the width of the bright zones is approximately equal to the width of the image strips. The field of view of the autostereoscopic or dynamic image may be altered by varying the widths of the bright zones and the image strips.

37 Claims, 9 Drawing Sheets

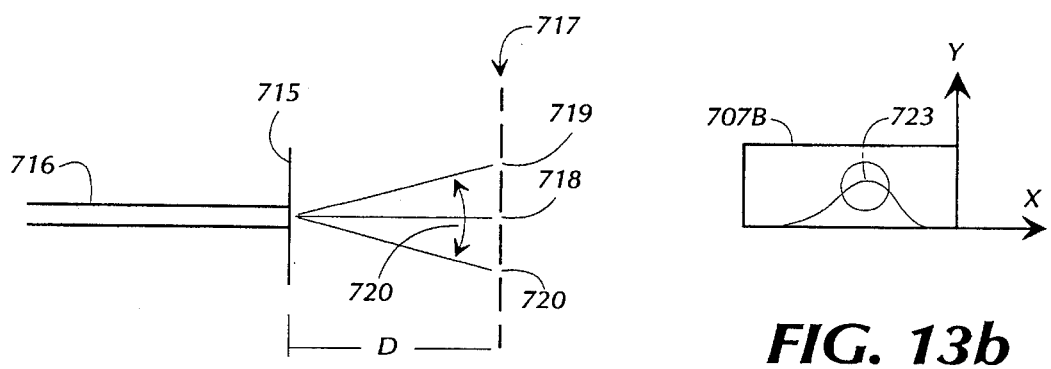
FIG. 13a  FIG. 13b
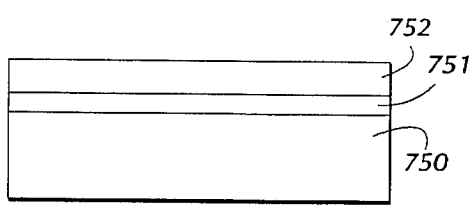
FIG. 14a
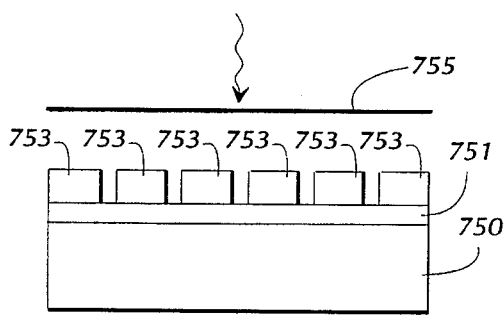
FIG. 14b
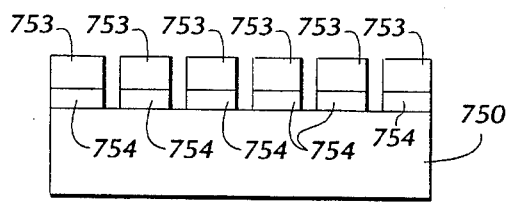
FIG. 14c
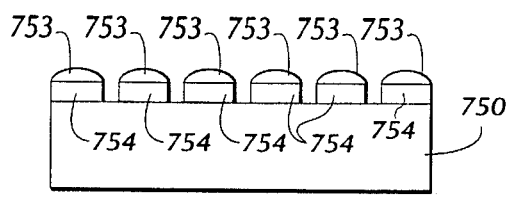
FIG. 14d
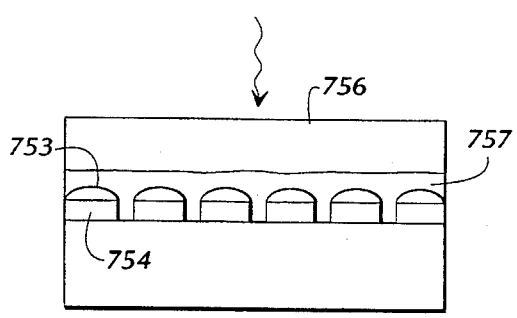
FIG. 14e
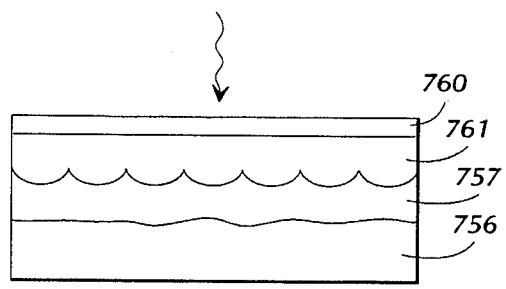
FIG. 14f

APPARATUS FOR PROVIDING AUTOSTEREOSCOPIC AND DYNAMIC IMAGES AND METHOD OF MANUFACTURING SAME

This application is a continuation-in-part of a currently pending International Application having International Application No. PCT/US93/07784, filed Aug. 17, 1993, entitled "Apparatus For Providing Autostereoscopic And Dynamic Images And Method Of Manufacturing Same", which is a continuation-in-part of a currently U.S. application, application Ser. No. 07/931,871, filed Aug. 18, 1992, entitled "Apparatus For Providing Autostereoscopic and Dynamic Images", now U.S. Pat. No. 5,359,454.

TECHNICAL FIELD

The present invention relates to the production and display of autostereoscopic and dynamic images, and more particularly to a technique for producing autostereoscopic and dynamic images in thin-film material. The present invention further relates to producing and displaying autostereoscopic and dynamic images by interleaving images in a layer of emulsion which is illuminated by an inner optic which provides light direction control.

BACKGROUND OF THE INVENTION

Currently, image display methods which enable the presentation of multiple images from different viewing angles fall into three broad categories: projection-type (non-holographic) displays, lens-sheet displays and holographic displays. Any of these methods can be used to display autostereoscopic depth images, motion images and color changing images.

The most common technique of producing projection-type displays is the barrier strip method. A barrier strip display device consists of an interleaved image which typically consists of strips taken from each of the images that are to be displayed. The strips comprising each of the images are interleaved parallel to each other so that every Nth strip is from the same image, where N is the number of images. This number may be as small as two or as large as nineteen or more. The interleaved image is disposed in close proximity to and parallel to a viewing mask. The viewing mask contains parallel opaque lines of equal width which are separated by transparent zones having a uniform width which is equal to or less than that of the opaque lines. Barrier strip images are usually viewed from the mask side by means of light transmitted through the interleaved image and the mask. The intensity of the back illumination required depends on the brightness of the viewing environment and on the number of images which are interleaved. The color that is perceived at a particular point and at a particular viewing angle with a barrier strip display device is determined by the color of the image strip which is visible through the mask at that point.

Though barrier strips are capable of displaying autostereoscopic images, a barrier strip display device will produce this effect only when certain conditions are satisfied. First, the mask lines must lie in a plane orthogonal to that of the observer's eyes. Also, the width and spacing of the transparent mask lines and the distance from the interleaved image to the mask must be such that each of the viewer's eyes sees different, non-overlapping regions of the interleaved image through the transparent mask lines. The interleaved image must have been constructed such that each of the image lines visible to the right eye is part of a right eye stereo pair image, and the image lines visible to the left eye are each part of a matching left eye stereo pair image. The distances and positions at which stereoscopic depth is perceived is restricted by the geometry of the mask, the number of interleaved images and the mask-to-image distance.

In addition to the difficulty in achieving an autostereoscopic effect, a significant limitation on barrier strip image devices is that the thickness of such a device is governed by the number of images it presents, the width of the image strips and the intended viewing distance. The distance between the barrier strips mask and the interleaved image is generally a large multiple of the width of a single image strip. A typical barrier strip device has a thickness of about six (6) millimeters, making it an unacceptable technology for mass production. The barrier strip method is further limited in that it is only useful as a back-illuminated image display method.

Among the most common lens-sheet display techniques are integral photography, integrams and lenticular sheets. Integral photography (referred to in the trade as the "fly-eye" approach) involves photographing an image through a plastic sheet into which small fly's-eye lenses (typically 50,000 lenses per sheet) have been impressed. The lenses cause a complete reproduction of the photographed image to be reproduced behind each tiny lens. This approach can recreate a visually complete three-dimensional image, but can only be reproduced at great expense. A further limitation of this lens sheet is that the images are at such a fine resolution that they cannot be reproduced on printing presses, but have to be reproduced photographically. Images produced by this method also have a very restricted viewing angle within which the image reconstructs correctly.

The integram approach to lens-sheet displays is a complex extension of the fly-eye approach. It involves positioning the captured image along a precisely curved surface (dimensionally matching the focal surface of the fly-eye lens) to overcome the viewing angle restrictions. The expense and difficulty in producing high quality three-dimensional images with this method, however, have prevented any large scale commercial success.

A third method of the lens-sheet display technique currently known is the lenticular screen display device. A lenticular screen display device employs an array of cylindrical lenses to control the viewing angle of interleaved image strip. The lenses are disposed parallel to the image strips between the observer and the image strips such that the image strips directly underneath a lens lies at or near the lens' focal plane. The range of angles through which the image will be visible is determined by the position of each image strip underneath the lens array. As with the barrier strip method, the color of the image strip determines the color that will be perceived at that point of the lenticular screen processed image.

As with the barrier strip method, a significant limitation on the lenticular screen display device is that its thickness is dependent on the width of the image strips. The thickness also is limited by the number of images presented, the designed viewing distance, and the focal properties of the lens. The thickness of these devices is in general greater than the width of the image strip multiplied by the number of images. As a result, a typical lenticular screen display device has a thickness of about one (1) millimeter, making it relatively expensive for mass production, and generally too thick for automated printing press equipment.

The third broad category of currently known methods of producing and displaying autostereoscopic images is holographic displays. Holographic displays use holograms to reconstruct the appearance of an object over an angular range of view without the use of a lens. A hologram is a record of a diffraction pattern representing an object as viewed from a certain range of positions. There are many types of holograms, each of which possesses its own range of viewing conditions. Some holograms require laser illumination for the reconstruction of an image, while others can be viewed by means of incoherent white light. Holograms displaying full color over a range of viewing angles normally require illumination by three lasers—red, blue and green—simultaneously. White light viewable holograms are generally either monochromatic or display a rainbow coloration which varies according to the viewing angle. Holograms are capable of displaying autostereoscopic, motion, combined autostereoscopic and motion, and color-change images. However, creating and reproducing a high quality hologram is a time-consuming and difficult process. Holograms cannot be created by printing and are not easily combined with the mass production of printed articles. Holograms are expensive and difficult to originate. They also require special equipment to impress onto a printing substrate. Because, of their restrictive viewing conditions and limited control of color, the practical applications of holographic displays is very limited.

The present invention provides a device for displaying autostereoscopic and dynamic images which eliminates the need for lenses, as required in conventional lens-sheet display devices, as well as the need for barrier strips, as required inconventional barrier strip display devices. The device of the present invention utilizes an inner optic which illuminates image strips formed in a layer of emulsion. The inner optic also provides the light direction control needed to produce the perception of autostereoscopic depth, motion, or color change.

SUMMARY OF THE INVENTION

The present invention comprises an apparatus for producing autostereoscopic or dynamic images. The apparatus comprises an inner optic, a substrate, and a layer of emulsion having interleaved images formed therein. In a preferred embodiment, the inner optic incorporates reflective regions which redirect ambient light to provide back illumination of the image strips formed in the layer of emulsion. In another embodiment, the inner optic incorporates transmissive regions which provide directional control of light passing through the inner optic for back illumination of the image strips formed in the layer of emulsion. In both of these embodiments the inner optic provides the light direction control needed to produce the perception of autostereoscopic depth, motion, or color change.

One advantage of the present invention over the prior art is that focusing elements are not needed to control the direction of light in order to produce an autostereoscopic image, as are generally required in conventional lens-sheet display devices. Furthermore, since the inner optic of the present invention provides illumination of the image strips as well as light direction control, the light direction control function of the barrier strip can be accomplished while avoiding the disadvantages inherent in conventional barrier strip techniques. For example, conventional barrier strip techniques require a large amount of light for back-illuminating the image strips due to the fact that the barrier strip selectively blocks light in order to allow an observer to see a stereo pair of image strips. Furthermore, the greater the number of images used to create the autostereoscopic image, the smaller the width of the slits in the barrier strips and consequently, the greater the amount of light needed to illuminate the image.

Another advantage of the present invention is that a much higher resolution may be obtained by interleaving images in an emulsion than that which can be obtained by printing. Generally, image strips obtained in the emulsion are much narrower in width than print dots. The light direction control is provided by bright zones and dark zones in the inner optic. The bright zones are approximately equal in width to the image strips. By narrowing the widths of the bright zones and the image strips, the field of view can be narrowed. This allows the distance from which an observer perceives an autostereoscopic image to be increased. Therefore, the widths of the bright zones and image strips may be selectively altered to achieve the desired field of view.

A further advantage of the present invention relates to the ease with which the device of the present invention may be used with conventional photoprocessing techniques. For example, the device of the present invention may be embossed onto a conventional photographic paper substrate. A layer of emulsion may then be applied to the transparent substrate of the present invention. Conventional photoprocessing techniques may then be used to expose and develop the emulsion to produce an interleaved image therein.

The present invention may be used as a transmission material, in which case the bright zones of the inner optic are substantially transparent and the image is back-illuminated through the inner optic. It may also be used as a reflection material, in which case the bright zones of the inner optic may be specularly reflective, diffusively reflective, or may bear a reflective diffraction pattern which concentrates light from one direction and redirects it towards the observer.

Accordingly, it is an object of the present invention to provide a method for producing novel materials which display multiple images from different viewing directions.

It is also an object of the present invention to provide a device which displays autostereoscopic or dynamic images and which avoids the need for focusing elements.

It is still another object of the present invention to provide a light control optic which is self-luminous in that it incorporates reflective regions which redirect ambient light to provide back illumination of the image strips formed in the layer of emulsion. The light control optic also provides directional control of the light.

It is yet another object of the present invention to provide a device which displays autostereoscopic or dynamic images and which is suitable for use with conventional photoprocessing techniques.

It is another object of the present invention to provide means for controlling the field of view of the autostereoscopic image.

It is yet another object of the present invention to provide a method for producing engineered light control films.

It is still another object of the present invention to provide a method for increasing the brightness of printed images.

A further object of the present invention is to provide a method for producing thin film images which display motion.

It is yet another object of the present invention to provide a method for producing the film images which display color changes when viewed from different angles.

BRIEF DESCRIPTION OF THE DRAWINGS

FIG. 13a illustrates the interference pattern utilized by the laser scale detection unit of the embossing system of FIG. 12;

FIG. 13b illustrates a functional block diagram of one of the detectors of the laser scale detection unit;

FIGS. 14a–14g illustrate a method for creating the light control optics and focusing optics masters;

DETAILED DESCRIPTION

Figure 1:
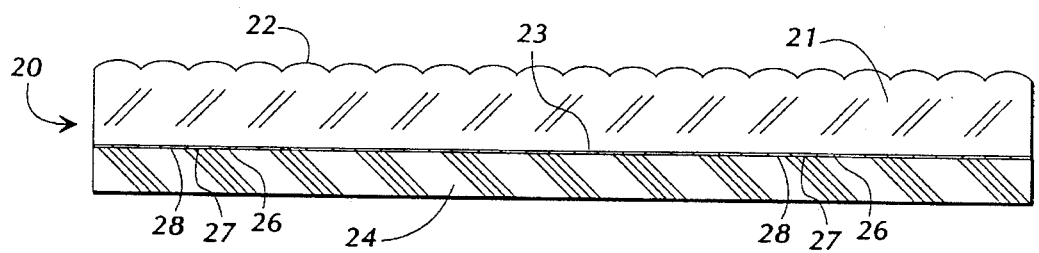
FIG. 1 is a cross-sectional view of a prior-art conventional lenticular screen structure.

Referring now in detail to the drawing figures, in which like reference numerals represent like parts throughout the several figures, FIGS. 1 and 2a–c show a conventional lenticular screen display device 20, which consists of a layer of optical material 21 bearing an array of cylindrical lenses 22 on its upper surface and an image 23 in contact with its lower surface. The image 23 is generally supported upon a substrate 24. The image 23 is typically created by interleaving image strips from a multiplicity of images. If, for example, three images are used, then image 23 would consist of right, center, and left image strips 26, 27 and 28.

Figure 2A:
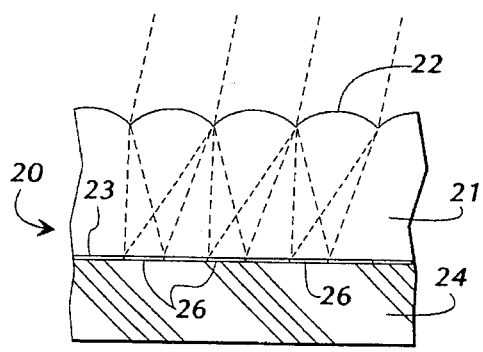
FIGS. 2a–2c are cross-sectional views of a conventional lenticular screen structure illustrating the direction of view from each of the right, center, and left image strips.
Figure 2B:
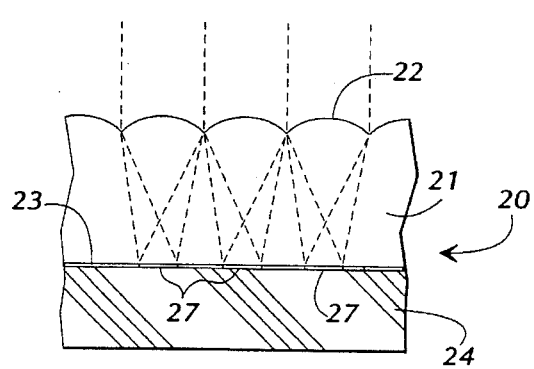
Figure 2C:
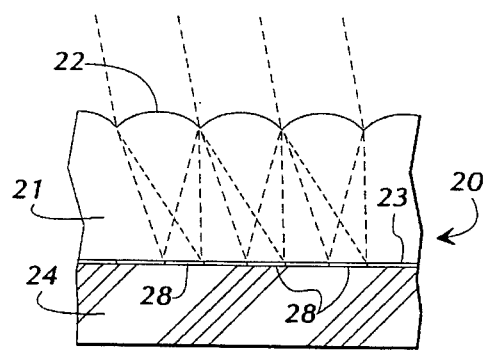

FIG. 2a depicts how the array of lenses 22 in the conventional lenticular screen display device 20 controls the direction of view of each of the right image strips 26. Light reflecting from each image strip 26 is directed by the lenses 22 toward the observer's right eye. FIG. 2b depicts that the center image strips 27 are located adjacent to the right image strips. By virtue of their different positions underneath the lens array 22, the light reflected from the center image strips 27 is directed by the lenses 22 in a slightly different direction than that of the right image strips. Light form these strips may be intercepted by the observer's left eye. In the case of an autostereoscopic image, the observer would be viewing a stereo pair, different images with each eye, and would thus perceive a stereoscopic image. FIG. 2c depicts how light reflecting from the left image strip is similarly directed in a third direction. If the observer's position changes such that the center image is intercepted by the right eye and the left image is intercepted by the left eye, a slightly different view of the autostereoscopic scene will be perceived, since right and center images comprise a stereo pair, and center and left comprise a stereo pair.

Figure 3A:
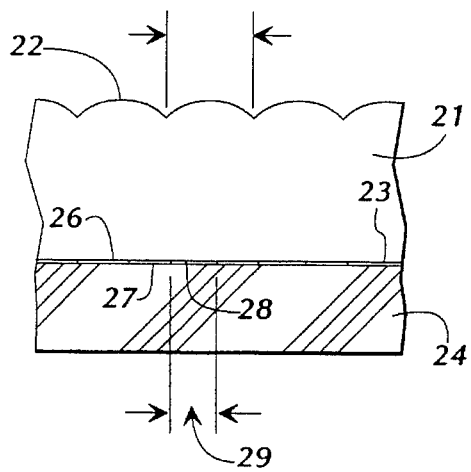
FIGS. 3a–3b are comparison scale drawings illustrating the thickness of a conventional lenticular screen structure and that of the present invention according to a first embodiment.

The width of the individual lenses in the conventional lenticular screen method must be some multiple, n, of the image strip width, where n is an integer. Because of the limitations of the focusing optics 22, the thickness of the lens in a lenticular screen display device will also be some multiple of the print strip width 29, as shown in FIG. 3a. The minimum strip width of printed images is set by the smallest shape which can be reliably printed, which will generally be the size of a single print dot. Printing presses vary in their printing resolution, but a commercial printing press rarely exceeds a printing resolution of 175 lines/inch, or a print dot spacing of about six thousandths of an inch (152 microns). As a result, the width and thickness of a conventional lenticular screen device 20 can never be less and is typically much larger than the dimensions of the print dot spacing.

Figure 3B:
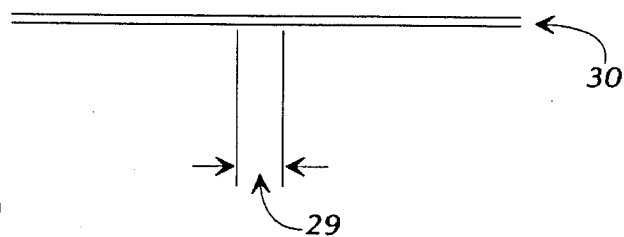

The present invention circumvents this size limitation. The thickness of the present invention is independent of the print dot spacing and the size of the print. FIG. 3B illustrates the relative thickness of the present invention 30 for the same print width 29. FIGS. 3A and 3B are drawn to the same scale to show the magnitude of the difference between the thickness of a conventional lenticular screen device and that of the present invention for the same print width. The optical thickness of the present invention for images printed at 175 lines/inch would typically fall in the range of from 1–5 mils, compared with 17 to 50 mils for a conventional lenticular screen device.

Figure 4A:
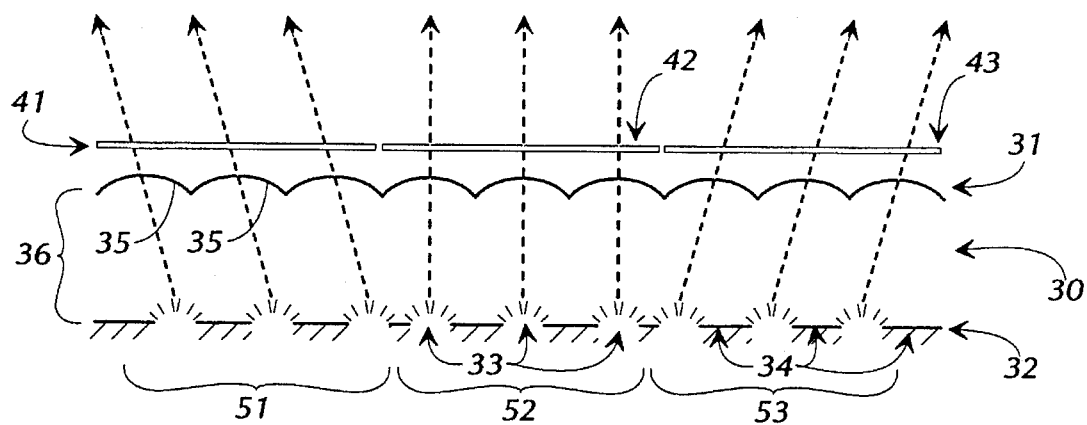
FIG. 4a is a cross-sectional view of a first embodiment according to the present invention including three image elements.

Referring now to FIG. 4a, the basic operation of the present invention will be described. The light control material 30 comprises a two-layer optical system separated by a refractive material 36. It is the two-layer optical system that allows the thickness of the device to be independent of the print size. In one embodiment of the present invention, the first layer comprises focusing optics 31 and is sometimes referred to as the "outer optic" (i.e., closest to the observer). The focusing optics 31 generally consist of an array of lens elements 35. The second layer contains light control optics 32 and is sometimes referred to as the "inner optic". The layer of light control optics 32 consists of a pattern of bright zones 33 disposed generally parallel to the axial direction of the focusing elements 35. The bright zones 33 are separated from each other by dark zones 34, which may be either light absorbing or light dispersing. The composition of the focusing optics 31 and the light control optics 32 will be discussed in detail below.

FIG. 4a also illustrates the cooperation of the focusing optics 31 and the light control optics 32 for light directional control. In FIG. 4a the light source (not shown) is located underneath the light control optics 32, and the light control material 30 is operating in a light transmissive mode. Three image elements (left image element 41, center image element 42, and right image element 43) are placed above the focusing optics 31. While FIG. 4a shows three image elements, the present invention is not limited to that number of image sets. The device will operate with as few as two sets of image elements (e.g., up/down or left/right) or with many more than that. Some applications which are not brightness sensitive could tolerate (and benefit from) a large number of image sets, such as four, five, or more. The relative positions of the image elements 41–43 and the focusing optics also is not important. The light directional control function may be performed with the image elements 41–43 placed either above the focusing optics 31 as shown in FIG. 4a, in between the focusing optics 31 and the light control optics 32, or below the light control optics 32.

Assuming the device is operating with three sets of image elements, the light control material is divided into three image zones—a left image zone 51, a center image zone 52 and a right image zone 53. The center image zone 52 is formed by positioning the associated bright zones 33 directly below the center of the lens elements 35. Light passing through the center image zone 52 will be directed through the focusing optics 31 above it and transmitted through the center image element 42 as center directed light (this light may be intercepted by the observer's right eye). The left image zone 51 is formed by laterally shifting the position of the associated bright zones 33 to the right so that the center of the bright zones are no longer aligned with the center of the lens elements 35. Light passing through the left image zone 51 will then be directed through the left image element 41 and transmitted as left directed light (this light may be intercepted by the observer's left eye, forming a stereo pair with the center image zone light directed to the right eye). The right image zone 53 is similarly formed by laterally shifting the associated bright zones 33 to the left. Light passing through the right image zone 53 will be directed through the right element 43 and transmitted as right directed light (if the observer's position shifts so that the center image light is intercepted by the observer's left eye, then the right directed light may be intercepted by the observer's right eye, forming a stereo pair).

The image elements 41–43 can be composed of transparent, colored print dots that serve to color the light but will not control the directions of visibility of the lenses depicted. The resulting system therefore enables an observer to perceive one set of image elements from one eye and a different set of image elements from the other eye, thereby creating the perception of autostereoscopic depth, motion or color change.

FIG. 4a shows three sets of lenses 35 for each image element for simplicity. However, the present invention need not be limited to this number. The number of lenses that are spanned by each image element will be a design variable, depending on the printing resolution, the width of the image elements, and the size of the lenses. The actual number of lenses devoted to a single image element can range from one lens to more than twenty. A typical number will be six to nine lenses per image element. The image elements do not necessarily have to cover the entire surface of the light control material. In general, each image element need only lie over its respective image zone, but the image elements do not have to be in perfect registration with the image zones. Also, the spacing between the image elements is not critical. Each image element does not have to be equally spaced from the edge of its respective image zone.

Figure 4B:
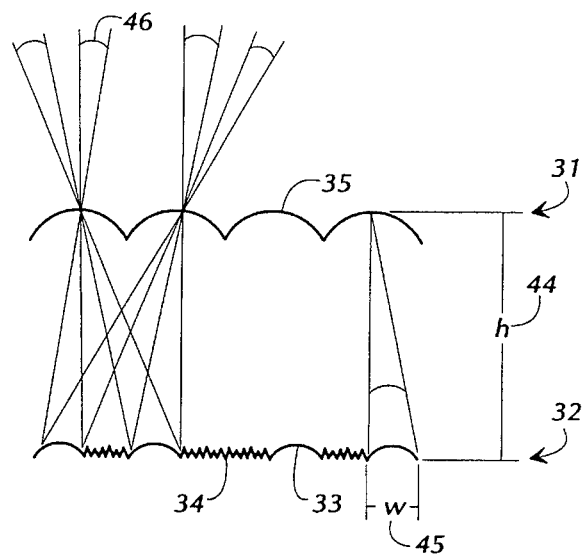
FIG. 4b illustrates an alternative embodiment of the light control optics of the present invention.

FIG. 4b illustrates how the present invention enables the field of view (F.O.V.) to be adjusted without altering the distance between the light control optics 32 and the focusing optics 31. The field of view 46 corresponds to the area over which an observer will see a particular image element. With the light control material 30, FIG. 4a, the field of view can be adjusted by selectively altering the distance between the inner and outer optics and by correspondingly adjusting the focal length of the outer optic. As indicated in FIG. 4b the field of view 46 is related to the distance 44 between the inner and outer optics and the width of the bright zones 45. The relationship is described by the equation F.O.V.=arc tan (w/h). If the widths of the bright zones 45 in FIG. 4b are decreased, the fields of view 46 become narrower. However, merely decreasing the widths of the bright zones will distort the interlacing of the images with respect to the observer. Furthermore, merely decreasing the width of the bright zones will decrease the amount of brightness coming from the light control optics 110, thereby decreasing the brightness of the image. Increasing the width of the bright zones will expand the fields of view but it will also distort the interlacing of the images with respect to the observer.

Figure 4C:
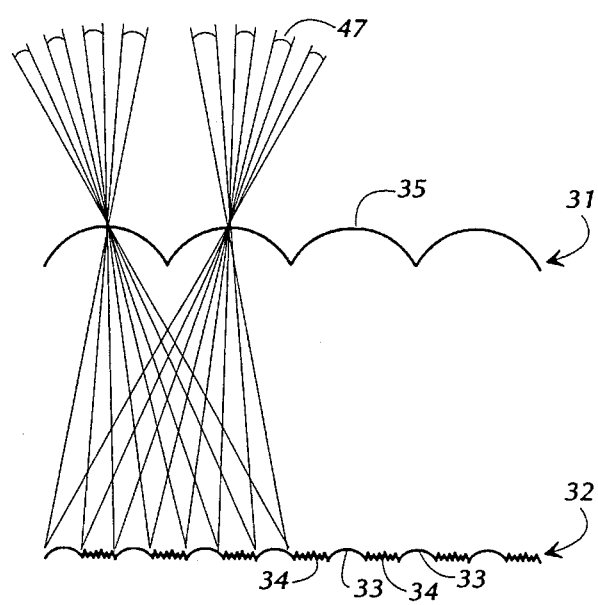
FIG. 4c illustrates how the field of view may be controlled.

FIG. 4c illustrates how the fields of view can be controlled without decreasing the amount of light coming from the light control optics and without distorting the interlacing of the image. In the embodiments of FIGS. 4b and 4c, two sets of image elements (not shown) are utilized to obtain the autostereoscopic image. By decreasing the widths of the bright zones 33, the fields of view 47 are narrowed. However, the amount of light coming from the inner optic 32 has not decreased since there are two bright zones 33 under each lens 35, the sum of the areas of which equals the area of one of the bright zones 33 shown in FIG. 4b. Also, the alternating pattern of the bright and dark zones in the inner optic shown in FIG. 4c maintains the interlacing of the images with respect to the observer.

Therefore, by having multiple bright zones with respect to each lens, the field of view can be controlled while maintaining the brightness and interlacing of the images. Furthermore, the field of view can be controlled in this manner regardless of the number of sets of image elements utilized to create the autostereoscopic image. However, the pattern of the bright and dark zones in the inner optic will vary depending on the number of sets of image elements used to create the autostereoscopic image. The period of the light control optics, as indicated by the pattern of bright zones and dark zones, changes from one image strip to the next (i.e., in accordance with the interleaving of the image strips). Although FIG. 4c illustrates two bright zones for each lens, the present invention is not limited to a particular number of bright zones and dark zones for each lens. Furthermore, the bright zones can be transmissive or reflective, although the preferred embodiment of the invention utilizes bright zones which are reflective.

The light control optics shown in FIGS. 4b and 4c represent a preferred embodiment of the present invention for the bright zones and dark zones. Cylindrical reflectors can be used to create the bright zones. By using cylindrical reflectors, light is reflected from the light control optics through a wide range of viewing angles. The light reflected from the light control optic avoids any specular reflection off of the surface of the image, thereby avoiding glare and enhancing the brightness of the image. Other arcuate reflectors, such as domes or ellipses, can also be used in the light control optics. When ellipses are used, an even wider range of viewing angles is realized. However, the intensity of the light reflected from the inner optics will be somewhat less when ellipses rather than cylinders are used as the bright zones.

The shape of the reflector used in the light control optic is selected in accordance with the range of viewing angles over which the brightness of the image is intended to be enhanced. Also, inverted dome-shaped (i.e., dish-shaped) reflectors can be used in the light control optic instead of dome-shaped reflectors. The effect of using dome-shaped or inverted dome-shaped reflectors is essentially the same, i.e., both enhance the brightness of an image over a particular range of viewing angles. The bright zones will be arcuate in shape regardless of whether the light control optic is operating in a transmissive or reflective mode. The light control optic will be coated with a reflective layer of metal when it is operating in the reflective mode. When operating in the transmissive mode, the bright zones will not be coated with a reflective layer of metal. The light control optic will be discussed in greater detail below.

The dark zones 34 are preferably comprised of a field of tapered elements. The tapered elements are formed by using reactive ion etching with oxygen as the reactive gas to create a non-uniform etch in a photopolymer. The result is a light trap comprised of stalagtite shaped structures which have large height-to-width ratios. The light traps will be described in detail below with respect to FIGS. 14a–17b.

Figure 5:
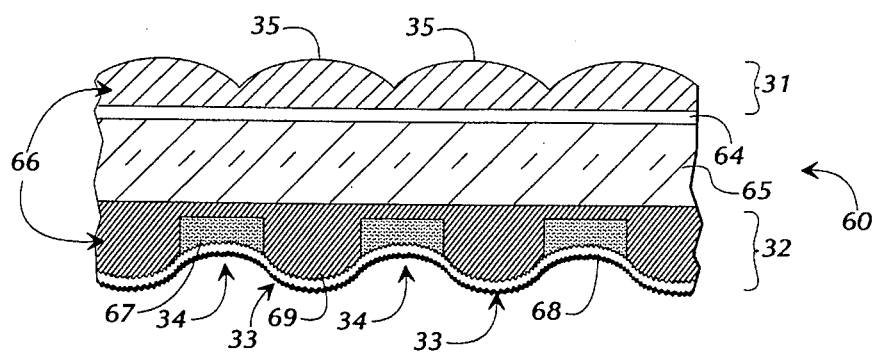
FIG. 5 is a cross-sectional view of the first alternative embodiment of the present invention.

While FIG. 5 shows the bright zones 33 in the center image zone 32 aligned directly beneath the center of the associated lens elements 35, this alignment is not critical to the performance of the invention. The actual position of the lens elements over the light control optics is not important. What is important is the pattern of the light control optics 32. The spacing of the bright zones is periodic in each image zone so that the period of the bright zones matches the period of the lens elements. As long as the lateral spacing of the light control optics is fixed and the lateral positioning of the focusing optics is fixed, the relative positions of the two layers is not important. This allows "slip" in the operation of the device and thus makes it easier to manufacture.

Viewed from above without any image elements, an observer looking at the light control material would see a set of very fine bright strips separated by very fine black strips. The relative width of the bright strips would depend on the pattern of the light control optics. With one eye, an observer would see one set of strips that are bright. The other eye would see a different set of strips that are bright. The set of strips that appear bright with the left eye will appear dark with the right eye, and vice versa. When the image elements are imposed onto the light control material, the observer is able to see one image element set with one eye and another image element set with the other eye, thus creating the perception of autostereoscopic depth, motion or color change.

Referring now to FIG. 5, the details of the focusing and light control optics will be explained. The focusing optics 31 consists of an array of refractive cylindrical lenses 35. Alternatively, the focusing optics may consist of diffractive lenses, hybrid refractive/diffractive cylindrical lenses, or reflective focusing troughs of conventional geometry, diffractive form or hybrid form. These lenses 35 will generally be made from a photopolymer 66 or other photo-initiated acrylated epoxies. A preferred method for producing the focusing optics is by "soft" embossing the photopolymer 66 onto an optical substrate 65, i.e., casting the liquid plastic against a roller that has the desired geometry and allowing it to cure. While "soft embossing" is preferred, other methods may be used to produce the focusing optics. For example, "hard" embossing, i.e., impressing a soft, but not liquid, plastic against a roller that has the desired pattern, can also be used to obtain the same desired effect. Additional methods suitable for producing the focusing optics include injection molding, compression molding, extrusion, and casting. The soft embossing technique is preferred because it generally enables higher precision replication than hard embossing and it also reduces the amount of tool wear. The width of the individual lenses 35 in the focusing optics 31 is very small, generally falling in the range from 8 to 25 microns.

FIG. 5 is a small enlarged section of the light control material of the present invention, showing a single image element 64 positioned between the focusing optics 31 and the light control optics 32. As noted above, however, the invention also will produce the desired effects if the positions of the image element 64 and focusing optics 31 are reversed.

The photopolymer 66 is embossed onto a transparent optical substrate 65. This substrate will preferably be a polyester material, but other commercial plastic film materials such as polypropylene can also be used.

The second layer of the light control material 30 contains light control optics 32. The light control optics 32 are designed to provide directional control of the light passing out through the focusing optics 31 to the observer. The layer of light control optics 32 consists of a pattern of bright zones 33 separated from each other by dark zones 34. In one embodiment, the distance from one edge of one bright zone 33 to the corresponding edge of the next bright zone is the same as the width of one lens above it. In another embodiment, the dark zones 34 are formed by applying an opaque material 67 onto those areas of a reflective surface 68 that are to absorb incident light. The opaque material 67 preferably comprises pigmented ink, but any light absorbing optical structure or light dispersing optical structure can also be used. Those zones of the reflective surface 68 not covered by the opaque material 67 form the bright zones 33 of the light control optics. Optionally, those areas that are to be bright zones 33 can also be formed by applying a diffractive, holographic, or diffusing pattern 69 on the bright zones of the light control optics. The reflective surface 68 conforms to diffractive, holographic, or diffusing pattern 69. The addition of a diffractive pattern 69 to the surface 68 serves to enhance the brightness of the bright zones 33 at chosen viewing angles. The light control optics 32 may be embossed with the same photopolymer 66 that is used to emboss the focusing optics 31. Layer 68 consists of a layer of highly reflective metal, preferably aluminum.

In the embodiment of FIG. 5, the light source (not shown) is above the focusing optics 31, and the invention will operate in a light reflective mode as compared to the light transmissive mode of the embodiment shown in FIG. 4a.

Figure 6:
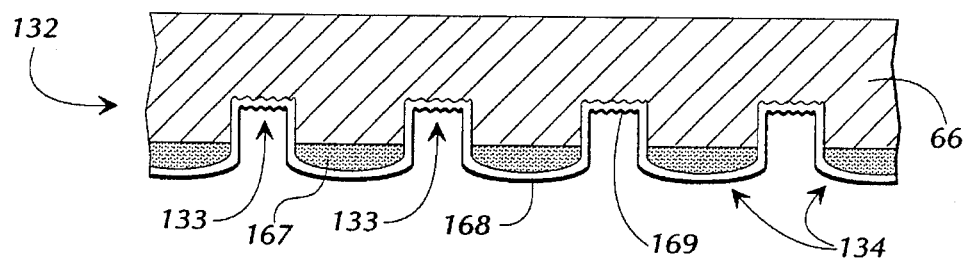
FIG. 6 shows a first alternative embodiment of the light control optics of the present invention.
Figure 7:
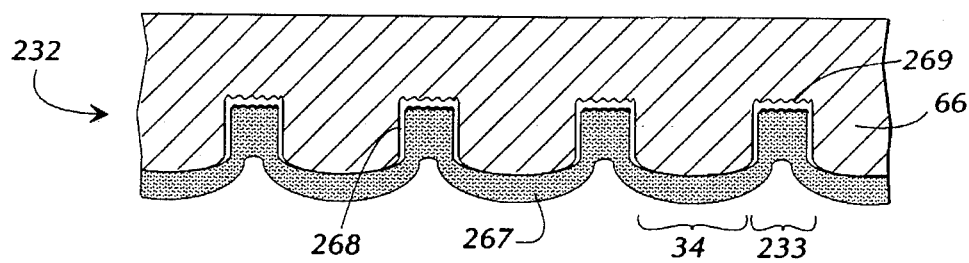
FIG. 7 shows a second alternative embodiment of the light control optics of the present invention.
Figure 8:
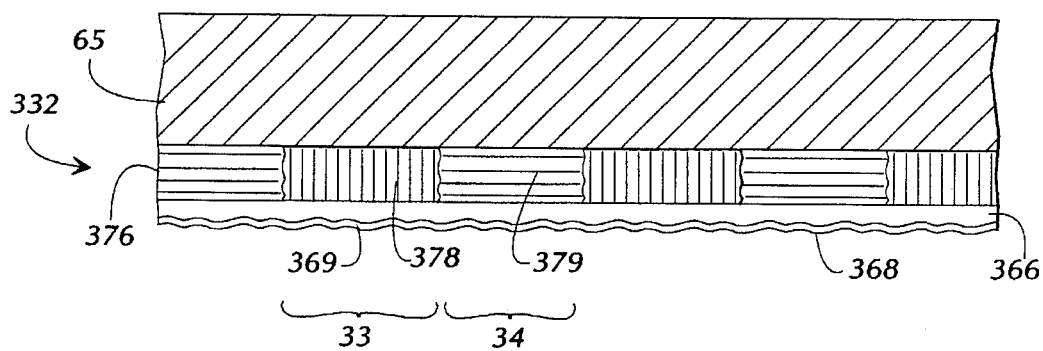
FIG. 8 shows a third alternative embodiment of the light control optics of the present invention.

While FIG. 5 shows one embodiment of the invention, there are numerous alternative ways of designing the light control optics, as shown in FIGS. 6–8. FIG. 6 shows an alternative design in which the geometric pattern of the light control optics 132 is the reverse of that shown in FIG. 5. In other words, the bright zones in this embodiment are located in those areas where the dark zones were located in the first embodiment. In this embodiment, the dark zones 134 are formed in the recessed notches created in the reflective substrate 168 with an opaque material 167 and the bright zones 133 are formed between. The relative positions of the dark zones and the bright zones along the light control optics are reversed from that of the embodiment shown in FIG. 5. In the embodiment of FIG. 6, the present invention will function in a light reflective mode due to the presence of the reflective layer 168.

FIG. 7 shows a second alternative design for the light control optics 232. In this design, the opaque material 267 is in effect the substrate. The bright zones 233 are shown with a reflective layer 268, preferably of aluminum, and a diffractive pattern 269. The bright zones 233 here are formed by covering selected portions of the opaque substrate with reflective layers 268.

FIG. 8 shows a third alternative design for the light control optics. In this embodiment, the light control optics 332 consist of a photographic emulsion layer 376. The bright zones are formed as transparent emulsion zones 378, and the dark zones are formed as opaque emulsions zones 379. A transparent material 366 (preferably a photopolymer) is layered below the photographic emulsion layer 376. Below the transparent material 366, a reflective layer 368 is applied to the diffractive pattern 369 so that the device will function as a reflective material.

Figure 9:
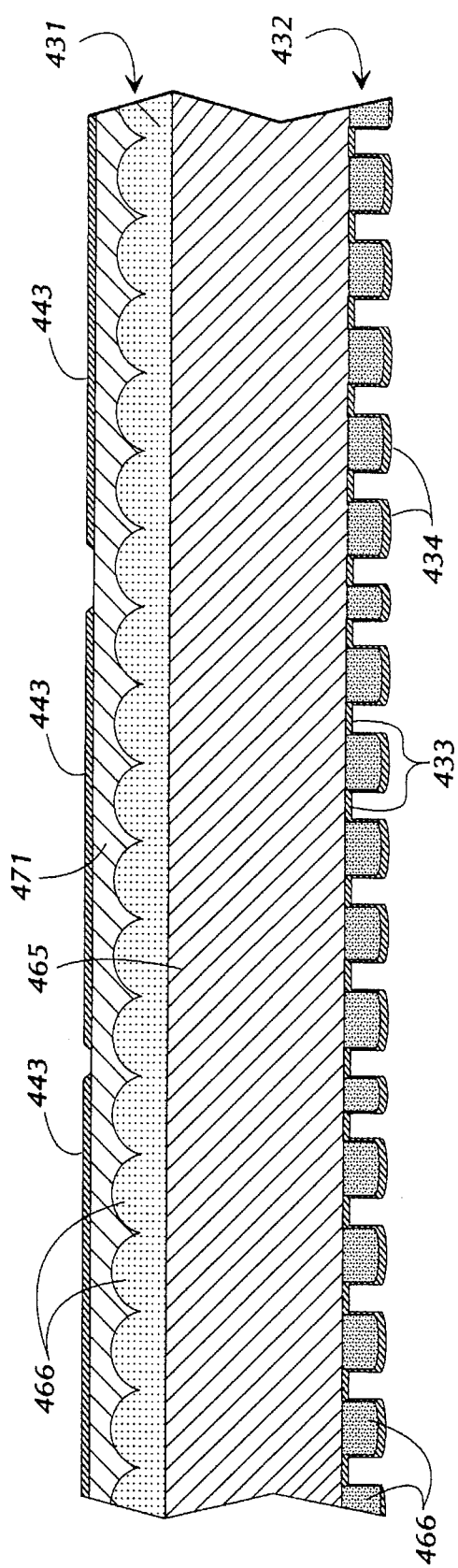
FIG. 9 is a cross-sectional view of another alternative embodiment of the present invention.

FIG. 9 shows another embodiment of the invention in which focusing optics 431 with a high refractive index are embedded in a low refractive index layer 471. Image elements 443 are located on top of layer 471. An inner optic 432 comprised of bright zones 433 and dark zones 434 is also provided. The focusing optics 431 will preferably be made from a photopolymer 466 with a refractive index of up to about 1.55, but other photopolymers with refractive indexes of about 1.6 can also be used. The low refractive index layer 471 will preferably consist of a polymer. The polymer does not necessarily have to be a photopolymer, but one could be used if it had a low enough refractive index. It is desirable that the polymer have as low a refractive index as possible in order to counterbalance the high refractive index of the focusing optics 431. Examples of polymers that can be used for the low refractive index layer 471 (and their respective refractive index) are polytetrafluoroethylene (PTFE, "Teflon") (1.35), fluorinated ethylene propylene (FEP) (1.34), polyvinylidene fluoride (PVDF) (1.42), and polytrifluorochloroethylene (PTFCE) (1.43). The function of the low refractive index layer 471 is to make the surface of the light control material smooth, thereby making the device more amenable for printing. The low refractive index layer may be formed by, for example, a melt process allowing the polymer to be applied as a liquid and to be self-leveling. The low refractive index layer 471 may also be used as an adhesive between the high refractive index lenses 431 and a polymer film having better printing characteristics. The focusing optics 431 are designed with a particular radius of curvature depending on the refractive index of the polymer. The lower the refractive index of the polymer 471, the lower the curvature of the lenses. The closer the refractive index of the polymer 471 approaches the refractive index of the photopolymer 466, the more curved the lenses have to be. The higher the refractive index of the photopolymer 466, the thinner the light control material. The greater the difference between the refractive indices, the shorter the focal length of the lenses. The smaller the difference, the longer the focal length of the lenses. Preferably, the difference between the refractive indices is on the order of 0.1 or greater.

The photopolymer 466 is embossed onto an optical substrate 465, consisting of a commercial plastic film such as polyester. In this embodiment, the refractive index of the optical substrate 465 is not critical. A change in the refractive index of the optical substrate 465 is easily compensated for by changing the thickness of the plastic film material. In general, the higher the refractive index of the optical substrate, the thicker the film material required. Photopolymer 466 is also used to fill the dark zones of the inner optic 432. For this purpose photopolymer 466 carries an opaque pigment.

Figure 10:
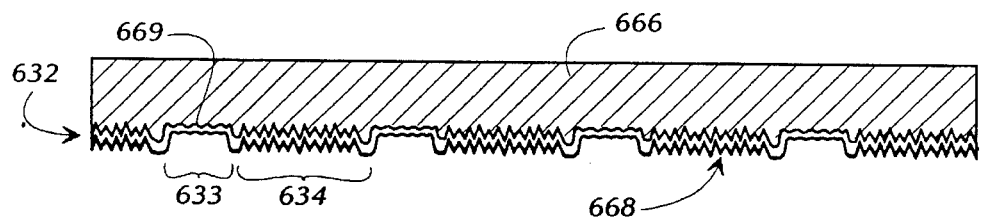
FIG. 10 is a cross-sectional view of a further alternative embodiment of the light control optics of the present invention.

FIG. 10 shows a further alternative embodiment for the light control optics 632 of the present invention. In this embodiment, the substrate is formed of a reflective layer 668 which comprises both bright zones 633 and dark zones 634. The bright zones have a diffractive pattern 669. The dark zones are formed of fields of tapered elements. In their preferred form the tapered elements in the dark zones have an aspect ratio of their height being 4 times their width or greater. In this manner, light entering the dark zones does not reflect back out of the dark zones. A photopolymer 666 as previously described covers the substrate.

Figure 11:
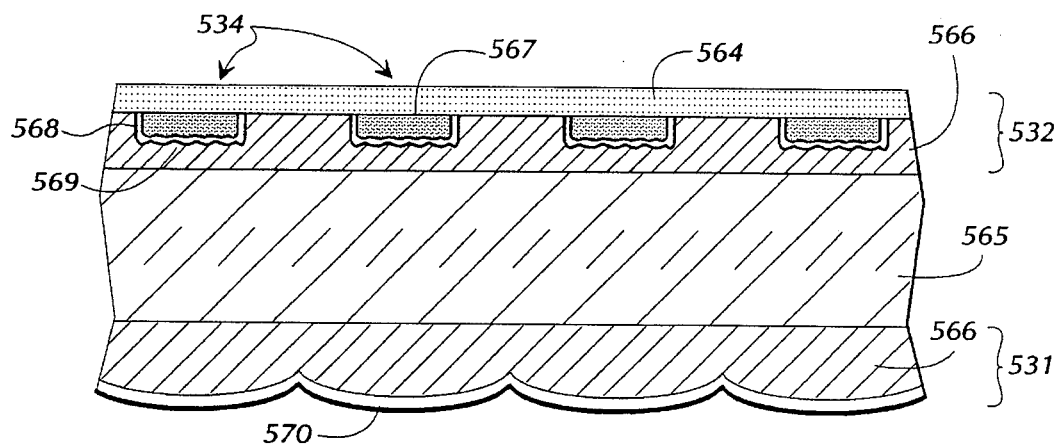
FIG. 11 is a cross-sectional view of yet another alternative embodiment of the present invention.

FIG. 11 shows another embodiment of the invention in which the relative positions of the focusing optics and light control optics are reversed. This embodiment also is formed using a transparent substrate 565. The light control optics 532, here used as the "outer optic", consists of zones 534 which appear dark from the outside of the structure but reflective from the inside of the structure, which zones are made by applying an opaque material 567 to a reflective substrate 568, such as aluminum. A diffractive pattern 569 may also be applied to the reflective substrate 568 to enhance the brightness of the image element 564. The dark zones of the light control outer optic consist of the transparent spaces between the reflective zones. The opaque material 567 prevents the reflective substrate regions 568 from reflecting light back to the observer without having first been reflected from the focusing optics 531. The focusing optics 531 are likewise used as the "inner optic" in this embodiment. The focusing elements are formed by embossing a photopolymer 566 to a transparent substrate 565 and coating the photopolymer surface with a reflective substrate 570. In this embodiment, the focusing optics 531 will function as focusing reflectors. The same photopolymer or other transparent embossing material 566 may be used to emboss the focusing optics 531 and the light control optics 532.

Figure 12:
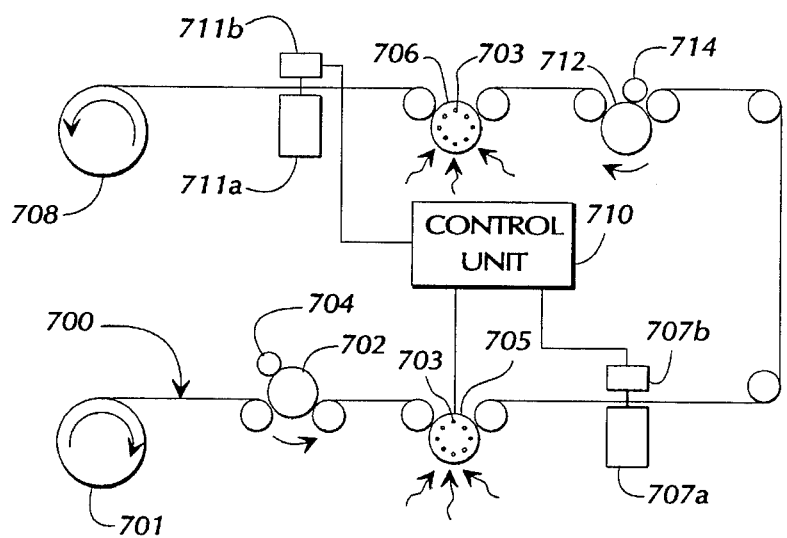
FIG. 12 shows a functional block diagram of the embossing system of the present invention.

FIG. 12 illustrates a block diagram of the embossing system used to emboss the focusing optics and the light control optics onto a film. Film Roll 701 is a roll of treated polyester or treated polypropylene which functions as the substrate upon which the inner and outer optics will be embossed. As the film 700 passes over the roller 702, the top surface of the film 700 is coated with a layer of liquid photopolymer. Roller 702 is preferably a Gravure roller which is a metal roller having a large number of very small pits etched into the surface. At the top of the roller there is a reservoir of liquid photopolymer (not shown). As the liquid photopolymer is applied to the surface of roller 702 from the reservoir, roller 704 scrapes the surface of roller 702 thereby allowing only the liquid photopolymer in the pits to remain on the roller. The excess liquid photopolymer is scraped away. This allows a metered amount of liquid photopolymer to be applied to the top surface of the film 700.

The film is then moved over embossing roller 705 which carries the master for the focusing optics. Rollers 705 and 706 are preferably thermosiphon chill rolls. A thermosiphon is an evacuated roller which is filled with a working fluid. The roller contains a large number of water cooling lines 703 which are located in close proximity to the surface of the roller. The working fluid is kept in contact with the surface of the roller through centrifugal force.

As heat is applied to the surface of the roller, the working fluid in contact therewith immediately evaporates. As the vapor comes into contact with the water cooling lines, it condenses and drips back down into the working fluid. This isothermal process allows large amounts of heat to be absorbed very uniformly while maintaining the entire surface of the roller at a constant temperature.

As the film moves over the embossing roller 705, the pattern of the focusing optics is formed in the liquid photopolymer. Once the pattern has been formed in the liquid photopolymer, ultraviolet light is applied to the film. This causes the photopolymer to harden and bond to the film. In general, during the hardening process the pattern formed in the photopolymer shrinks. By using the thermosiphon as the embossing roller, the photopolymer is maintained at a constant temperature. This reduces the possibility of local hot or cold spots in the photopolymer which result in nonuniformity in the scale of the pattern formed in the photopolymer. Once the focusing optic pattern has been formed, a laser scale detection unit 707a, b (described in detail below) is used to determine whether the scale of the outer optic embossment is correct.

The film with the focusing optics embossed thereon is then moved over a second Gravure roller 712. Gravure roller 712 in conjunction with roller 714 applies a metered amount of liquid photopolymer to the bottom surface of the film 700. The film is then moved over embossing roller 706 which carries the master for the inner optic. Once the inner optic pattern has been formed in the liquid photopolymer, ultraviolet light is applied to the film, thereby causing the photopolymer to harden and bond to the film.

The film having the inner and outer optic embossments formed thereon is then examined by a second laser scale detection unit 711a, b to determine whether the patterns are sufficiently close in scale. This information is then sent to the control unit 710. The control unit 710 receives information from the laser scale detection units and controls the temperatures of the thermosiphons 705 and 706 in accordance with this information. Therefore, the temperature of the thermosiphons 705 and 706 can be adjusted such that the scale of the inner optic embossment matches the scale of the outer optic embossment by means of thermal expansion and contraction of the embossing rollers 705 and 706.

FIG. 13a illustrates how the laser scale detection unit determines the scale of the embossments. The width of laser beam 716 is typically on the order of 1 millimeter. The focusing elements of the focusing optic 715 are typically on the order of 24 microns. Therefore, the focusing optic is comprised of approximately 40 focusing elements per millimeter. Due to the extremely small size of the focusing elements with respect to the laser beam, the focusing optic behaves like a diffraction grating which causes an interference pattern 717 to be created. The interference pattern 717 forms an array of spots 718, 719 and 720. Spots 718, 719 and 720 represent the zero order out, the first order out, and the minus one order out, respectively. By monitoring the exact locations of the first order out and the minus one order out, any change in the scale or period of the focusing optic can be determined.

FIG. 13b illustrates a block diagram of one of the laser detectors used to monitor the exact locations of the first order out and the minus order out of the interference pattern. Laser beam 716 has a gaussian distribution 723. Detector 707b (located at the projection of the spot pattern 717) tracks the location of the centroid of the spots in two dimensions. The detector 707b has a high enough resolution to track the location of the centroid to within one tenth of a micron. The distance D between the focusing optic 715 and the detectors 707b, 711b is known and therefore, the angle 720 can be calculated by control unit 710 in accordance with the distance D and the coordinates of the centroids. Angle 720 is used to determine the scale of the focusing optics pattern. This information is then utilized by the control unit 710 to control the temperatures of thermosiphons 705 and 706 to create embossments of the desired scale.

Once the focusing optics and the light control optics have been embossed on the film, laser scale detection 707a, b and 711a, b is used to determine whether the structure is satisfactory, i.e., whether the scale of the focusing optics matches the scale of the light control optics. If the periods do not match, detector 707b and/or 711b will detect two centroids instead of one. The control unit 710 will then notify an operator that the light control embossment is defective. The control unit 710 will then adjust the temperatures of either or both of the thermosiphons 705 and 706 in accordance with the scale information. Also, if the embossments do not match in scale, a human observer viewing the structure will see moiré banding and thereby detect a defect. The observer can then adjust the temperatures of the thermosiphons 705 and 706 accordingly.

Preferably, the photopolymer used to create the inner and outer optic embossments is a blend consisting of Ebercryl 3700 40%, trimethylolpropane triacrylate 40%, isobornyl acrylate 17% and CIBA-GEIGY Irgacure 184 3%. This blend cures by means of ultraviolet light. Other types of radiation cured material can also be used for this purpose.

Although the above-described embossing system represents a preferred embodiment for creating the light control material of the present invention, it will be apparent to those skilled in the art that variations of the system and the elements comprised therein can be used to create the necessary embossments.

Figure 14G:
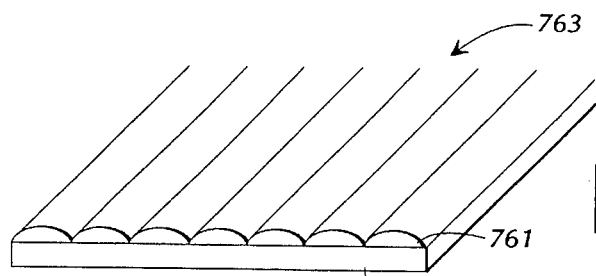

FIGS. 14a–14g illustrate a preferred embodiment of the present invention for fabricating the inner optic master. As shown in FIG. 14a, a substrate 750 is covered with a layer of chrome 751. On top of the layer of chrome 751 is a layer of photoresist 752. A mask 755 is placed over the structure as shown in FIG. 14b. The structure is then exposed to ultraviolet light. Clear areas in mask 755 correspond to areas in the photoresist which will be exposed to the ultraviolet light and subsequently developed away. After the exposed areas are developed away, pads of photoresist 753 are left on top of the chrome layer 751. An acid bath (not shown) is then used to etch away the chrome in positions which are not covered by the photoresist pads 753. The result is the structure shown in FIG. 14c. The chrome pads 754 act as an adhesion promotor between the photoresist pads 753 and the substrate 750. Photoresist heat flowing is then used to cause the photoresist pads 753 to flow, thereby creating dome shapes on top of the chrome pads as shown in FIG. 14d. A glass substrate 756 is placed in contact with liquid photopolymer 757 which is in contact with the structure of FIG. 14d, as shown in FIG. 14e. The structure is then exposed to ultraviolet light which causes inverted dome shapes to be created in the photopolymer 757. The master is comprised of layers 756 and 757 shown in FIG. 14f. FIG. 14f also shows how an embossment can be made from the master. A substrate 760, preferably a plastic film such as polyester, is placed in contact with liquid photopolymer 761. This structure is then exposed to ultraviolet light thereby causing photopolymer 761 to harden. The master and the embossment are then separated and the result is the embossment 763 shown in FIG. 14g.

Figure 15A:
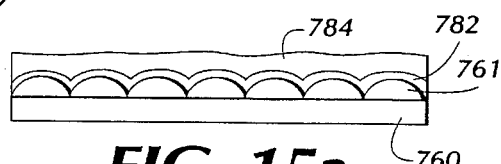
FIGS. 15a–15d illustrate a preferred embodiment for forming the dark zones in the light control optics master.
Figure 15B:
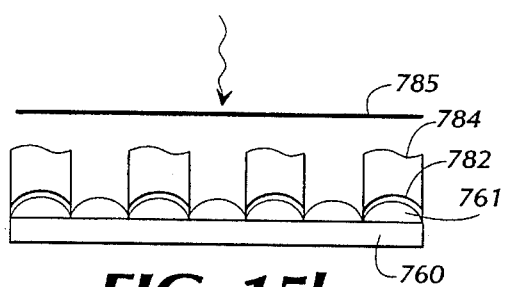

The preferred embodiment for forming the dark zones in the inner optic master will now be described with reference to FIGS. 14a–15d. The method discussed above with respect to FIGS. 14a–14f is first used to produce the structure shown in FIG. 14g in which substrate 760 is preferably glass. FIG. 15a shows a front view of the structure of FIG. 14g. The structure 763 is coated with a thin layer of metal 782 which is preferably chrome. The layer of metal 782 is spin coated with a layer of photoresist 784. Photoresist layer 784 is then exposed to ultraviolet light through a mask 785, as shown in FIG. 15b. The exposed photoresist is then developed away leaving the metal layer 782 exposed at the locations where the photoresist has been removed. The chrome is then etched away by an acid bath thereby exposing the cured layer of photopolymer 761 as shown in FIG. 15b. The photopolymer layer 761 is then etched by reactive ion etching. Preferably, oxygen is used as the reactive gas. Due to impurities in the composition of the cured photopolymer 761, the dry etching process creates light traps in the form of stalagtite-shaped or tapered structures 787 in the photopolymer 761. The dimensions of the tapaered structures are typically on the order of $0.5\mu$ to $4\mu$ in height and $0.1\mu$ to $2\mu$ in width. The high aspect ratios of the tapered structures cause light entering the light traps to be reflected at very shallow angles, thereby resulting in a great number of reflections within the light traps. Depending on the reflective characteristics of the light trap surface, approximately 40% of the light may be absorbed on initial impact and at each additional reflection. Therefore, very few reflections are required for the light to be absorbed. Virtually all of the light which enters the light trap will eventually be absorbed.

Figure 15C:
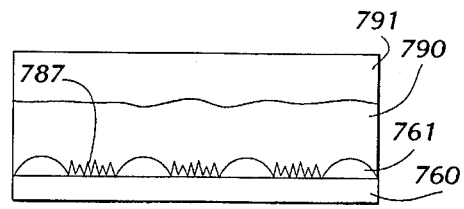
Figure 15D:
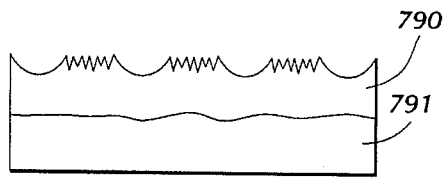

As shown in FIG. 15c, once the light traps 787 have been formed in the cured photopolymer layer 761, a layer of liquid photopolymer 790 is placed in contact with cured photopolymer layer 761. A transparent substrate 791 is placed in contact with the liquid photopolymer. The structure is then exposed to ultraviolet light (not shown) which hardens the liquid photopolymer 790. The hardened photopolymer 790 bonds with substrate 791. The substrate 791 and the hardened photopolymer 790 are then separated from the photopolymer layer 761 having the light traps 787 formed therein. The resulting master is shown in FIG. 15d. Alternatively, a metal embossing master may be formed from photopolymer layer 761 by conventional electroforming processes. For example, photopolymer layer 761 may be coated with a thin layer of metal, such as silver, by vapor deposition in order to render it electrically conductive. Electrical contact can then be made to the metal surface and a thick layer of nickel can be plated onto the surface by conventional electroforming processes. After deposition of a sufficient thickness of nickel, the nickel plated photopolymer layer 761 may be removed from the electroplating bath and the nickel master separated from photopolymer layer 761.

Figure 16A:
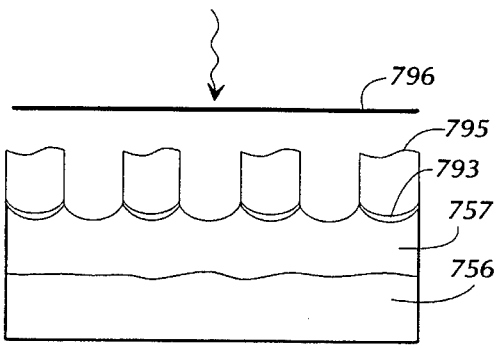
FIGS. 16a–16b illustrate an alternative embodiment for forming the dark zones in the light control optics master.
Figure 16B:
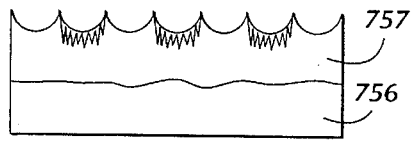

FIGS. 16a and 16b illustrate an alternative embodiment for creating the inner optic master. A structure comprising substrate 756 and a cured photopolymer layer 757, such as the one shown in FIG. 14f, is covered with a thin layer of metal 793 such as chrome. Metal layer 793 is covered with a layer of photoresist 795. The photoresist is exposed to ultraviolet light through mask 796 and the exposed photoresist is developed away leaving certain areas of metal layer 793 exposed. The exposed areas of the metal are then etched away by using an acid bath. The resulting structure is shown in FIG. 16a. Reactive ion etching is then used to etch the light traps into the photopolymer in the same manner as described above with respect to FIG. 15b. FIG. 16b represents the resulting inner optic master.

Figure 17A:
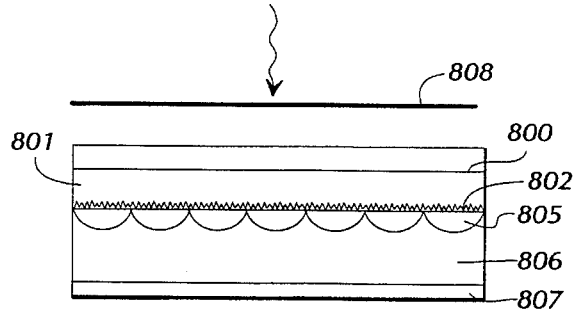
FIGS. 17a and 17b illustrate an alternative embodiment for creating the light control optics master.
Figure 17B:
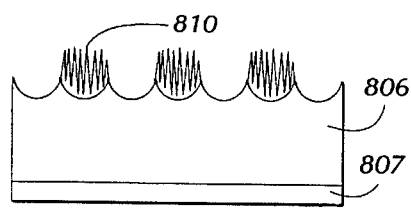

FIGS. 17a and 17b represent another alternative embodiment for generating the inner optic master. A master comprised of glass substrate 800 and a layer of cured photopolymer 801 having a light trap 802 formed throughout its entire surface is placed in contact with a layer of liquid photopolymer 805. The liquid photopolymer is also in contact with a cured layer of photopolymer 806 having inverted domed shapes formed therein. The structure is exposed to ultraviolet light through mask 808 which selectively cures photopolymer 810 in the regions exposed to ultraviolet light. The cured photopolymer 810 adheres to photopolymer 806 and remains with it when photopolymer 806 is separated from photopolymer 801. The residual uncured liquid photopolymer 805 remaining on photopolymer layer 806 may be removed by a solvent wash. The resulting inner optic master shown in FIG. 17b is comprised of substrate 807 and cured photopolymer layer 806 having the light traps 810 selectively formed therein.

It should be apparent to those skilled in the art that other techniques may be used to create the light control optics master of the present invention. For example, conventional techniques, such as diamond turning, may be used to form domed shapes in a layer of photopolymer. Reactive ion etching may then be used to generate the fields of tapered elements which constitute the light traps. Once the light control optic master has been produced, embossments can be easily generated therefrom by the procedures discussed above with respect to FIGS. 14f and 14g and with respect to FIGS. 15c and 15d. If it is desirable to use dome-shaped bright zones in the light control optic, one of the structures shown in FIGS. 15d, 16b or 17b may be used as the light control optic master. If it is desirable to use inverted, or dish-shaped, bright zones in the light control optic, one of the structures shown in FIGS. 15d, 16b or 17b will constitute the light control optic embossments.

Figure 18:
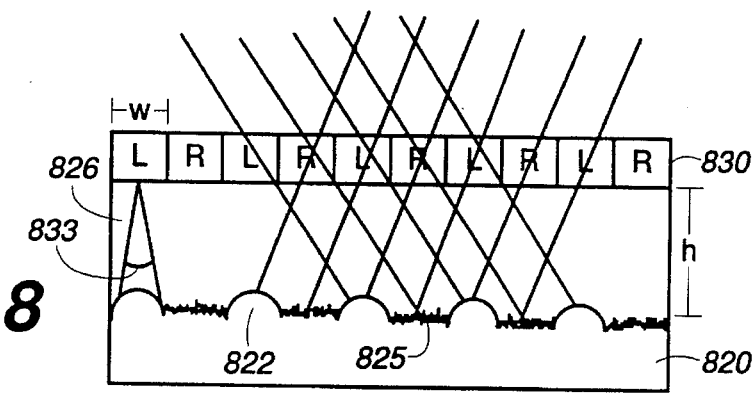
FIG. 18 illustrates a cross-sectional view of a preferred embodiment of the present invention for producing and displaying autostereoscopic and dynamic photographic images.

FIG. 18 illustrates a cross-sectional view of a preferred embodiment of the present invention for producing and displaying autostereoscopic and dynamic photographic images.

Preferably, the light control optic 820 is comprised of bright zones 822 and dark zones 825 which are essentially the same as the bright zones 33 and dark zones 34 described above with reference to FIGS. 4b and 4c. However, any of the light control optics described with respect to FIGS. 4a and 5–11 may also be used as the light control optic in the light control material of FIG. 18. Furthermore, the light control optic may operate in a transmissive or reflective mode. In the preferred embodiment, when the light control optic is operating in a reflective mode, the upper surface of the light control optics is coated with a thin layer of metal, preferably aluminum, which provides the desired reflectivity. When the light control optic is operating in a transmissive mode, only the light traps constituting the dark zones are coated with the reflective layer of metal. In the latter case, the reflective coating of the dark zones causes reflection and absorption of the light which enters the light traps. The reflective layer of metal is preferably put down by vapor deposition. However, any conventional technique for coating a surface with a thin layer of metal is suitable for use with the present invention. Returning again to FIG. 18, the period of the light control optic, which is characterized by the pattern of bright zones and dark zones, is constant. The light control optic 820 is embossed onto a substrate 826 which is preferably a layer of polyester. Substrate 826 is covered with a layer of preferably print-type emulsion 830. Other types of emulsions may also be used provided that they utilize transparent dyes as the means for coloring. Instant film emulsions are also suitable for use with the present invention. The emulsion is then exposed to form interleaved image strips in the emulsion.

The image strips are generally of the same width W as the bright zones 822 of the inner optic. The light control optic pattern of alternating bright and dark zones causes left directed light to illuminate the left image strips whereas no left directed light passes through the right image strips due to the locations of the dark zones. Likewise, right directed light illuminates the right image strips but not the left image strips. Therefore, one of the observer's eyes sees one set of image strips while the other eye sees the other set of image strips, thereby creating the perception of autostereoscopic depth, motion, or color change.

One of the advantages of the invention described with respect to FIG. 18 is that photographic images can be interleaved in a layer of emulsion to produce image strips which are much smaller than image strips which are obtained by printing. By reducing the width W of the image strips, the field of view can be narrowed. Narrowing the field of view increases the distance from which an observer can perceive an autostereoscopic image. Therefore, it is important to be able to control the field of view by means other than by increasing the height h of the substrate 826. Another advantage of using a layer of emulsion is that the emulsion can carry image detail which is much finer than the image detail which can be printed. Therefore, the autostereoscopic image produced by the embodiment of FIG. 18 can have a much higher resolution than an autostereoscopic image produced by printing.

The conventional barrier strip method utilizes a screen having slits therein which is placed above a back-illuminated image. The slits allow an observer to see a stereo pair of image strips. A disadvantage to this method is that a large amount of light is required to back-illuminate the image strips due to the fact that the barrier strip blocks the light everywhere except where a slit is located. Furthermore, the greater the number of images used to create the interleaved image strips, the smaller the width of the slits relative to the width of a period, i.e., more light is needed to illuminate the image.

The embodiment of FIG. 18 utilizes a light control optic pattern which produces an effect which is similar to the effect produced by the barrier strip method. However, the light control optic 820 provides light direction control by illuminating the image strips in accordance with the period of the bright and dark zones. In essence, the light control optic 820 provides illumination of the image strips as well as the light direction control needed to produce the autostereoscopic effect.

Figure 19A:
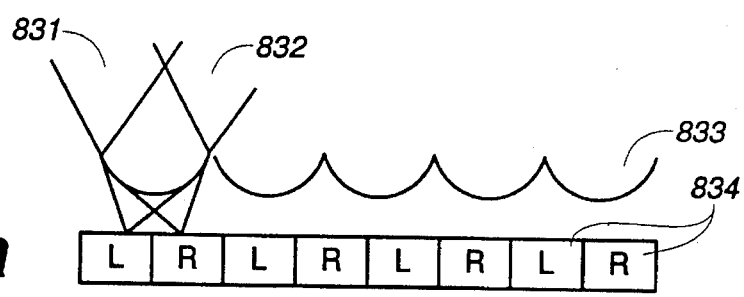
FIGS. 19a and 19b illustrate a first embodiment for forming interleaved image strips in the emulsion.
Figure 19B:
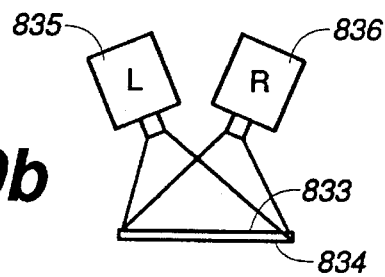

FIGS. 19*a* and 19*b* illustrate a first method for interleaving the images in emulsion 830. A lenticular screen 833 comprised of cylindrical lenses is placed above emulsion 830 such that the emulsion 830 is at the focal point of the cylindrical lens array. The emulsion 830 is then exposed to the images (e.g., left and right images) by projectors 835 and 836. The images may be presented simultaneously or in sequence. The angles of exposure and the focusing characteristics 831, 832 of the lenses cause interleaved image strips 834 to be produced in the emulsion when the emulsion is developed.

Figure 20A:
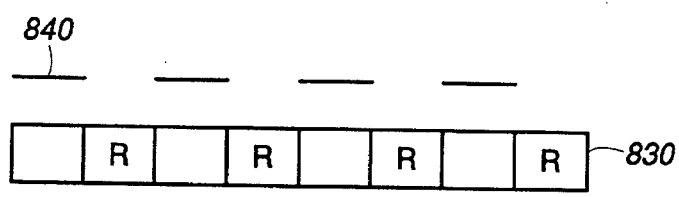
FIGS. 20a and 20b illustrate a second embodiment for forming interleaved image strips in the emulsion.
Figure 20B:
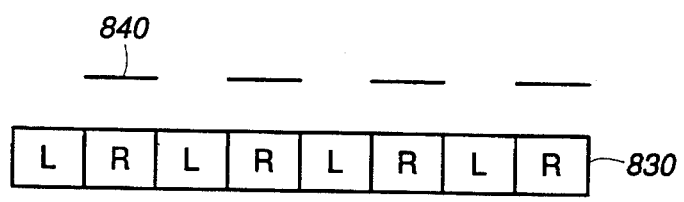

FIGS. 20*a* and 20*b* illustrate a second embodiment for interleaving the images in emulsion 830. The emulsion 830 is exposed to the right image through mask 840 as shown in FIG. 20*a*. The emulsion 830 can be exposed through contact printing or by projection with an enlarger (not shown). The mask 840 is then shifted to cover the right image strips and the emulsion is exposed to the left image. The emulsion is then developed, thereby producing interleaved left and right image strips in the emulsion, as shown in FIG. 20*b*. Although only left and right image strips are shown in FIGS. 18–20*b*, these embodiments are not limited to any particular number of images. Left and right images are shown merely for ease of illustration. The number of images which can be interleaved in emulsion 830 is limited only by the limitations of conventional techniques used for interleaving images in an emulsion.

One of the advantages of the invention described with regard to FIGS. 18–20*b* is that conventional photoprocessing techniques can be used to produce the autostereoscopic and dynamic images. Normally photographic materials consist of photographic paper with an emulsion thereon. The emulsion is exposed and developed to produce a photographic print. The present invention contemplates embossing the inner optic structure 830 and transparent substrate 836 onto a photographic paper substrate (not shown). The thickness of the paper substrate can vary as can the thickness of substrate 826 depending on the desired total thickness of the product. A layer of emulsion, preferably print-type emulsion, is applied to the top surface of the transparent substrate. The material which comprises the photographic paper, the inner optic, the transparent substrate, and the emulsion can be made commercially available as a photographic material. Conventional photoprocessing techniques can be used to expose and develop the emulsion to produce the autostereoscopic or dynamic images of the present invention. Although the exposure technique requires interleaving multiple images in the emulsion, conventional techniques used for exposing an emulsion to produce interleaved image strips in the emulsion are suitable for use with the present invention.

Generally, the width W of the image strips will be on the order of 0.001 inches. The thickness of transparent substrate 826 will depend on how thin the image strips can be produced. Generally, the height h of the transparent substrate will be on the order of 0.003 inches. The width of the bright zones 822 in the inner optic 820 is not a limiting factor and it will generally be equal to the width of the image strips. The field of view 833 can be narrowed by decreasing the width w of the image strips (and the width of the bright zones) or by increasing the thickness h of substrate 826, or both.

While the invention has been disclosed in preferred forms, it will be apparent to those skilled in the art that many modifications can be made to the invention without departing from the spirit and scope of the invention as set forth in the appended claims.

We claim:

1. A light control material comprising:

a transparent substrate having at least a top surface and a bottom surface;

a layer of emulsion disposed on said top surface of said transparent substrate, said layer of emulsion having interleaved photographic images formed therein;

light control optics having bright zones and dark zones formed therein, said light control optics bonded to, or formed in said bottom surface of said transparent substrate, said transparent substrate spacing said light control optics and said layer of emulsion a predetermined distance apart, said light control optics controlling the illumination of said interleaved photographic images such that an autostereoscopic or dynamic image is displayed.

2. A light control material according to claim 1 wherein said layer of emulsion is a layer of print-type emulsion.

3. A light control material according to claim 1 wherein said layer of emulsion is a layer of instant film emulsion.

4. A light control material according to claim 1 wherein said light control optics operate in a transmissive mode.

5. A light control material according to claim 4 wherein said bright zones have an arcuate shape and wherein said bright zones enhance the brightness of said interleaved photographic images over a range of viewing angles and wherein said arcuate shape controls said range of viewing angles.

6. A light control material according to claim 1 wherein said light control optics operate in a reflective mode and wherein at least said bright zones are covered with a reflective layer of metal, thereby providing illumination of said interleaved photographic images.

7. A light control material according to claim 6 wherein said bright zones have an arcuate shape and wherein said bright zones enhance the brightness of said interleaved photographic images over a range of viewing angles and wherein said arcuate shape controls said range of viewing angles.

8. A light control material according to claim 1 wherein said dark zones are comprised of light absorbing structures and wherein at least said dark zones are covered with a reflective layer of metal.

9. A light control material according to claim 1 wherein, said interleaved photographic images constitute image strips and wherein said bright zones and said image strips are substantially equal in width.

10. A light control material according to claim 9 wherein said autostereoscopic image has a field of view which can be altered by varying said width.

11. A light control material according to claim 1 wherein said light control optics have a constant period.

12. A light control material according to claim 1 wherein said substrate is a layer of polyester.

13. A light control material according to claim 1 wherein said light control optics are comprised of cured photopolymer.

14. A light control material according to claim 1 wherein said autostereoscopic image has a field of view which can be altered by varying said predetermined distance.

15. A light control material comprising:

a transparent substrate having at least a top surface and a bottom surface;

a layer of emulsion disposed on said top surface of said transparent substrate, said emulsion having interleaved photographic images formed therein, said interleaved photographic images constituting image strips;

light control optics having bright zones and dark zones formed therein, wherein said bright zones and dark zones are arranged in a pattern which has a constant spatial frequency and wherein said bright zones and said image strips are substantially equal in width, and wherein said light control optics are bonded to or formed in said bottom surface of said transparent substrate, said transparent substrate spacing said light control optics and said layer of emulsion a predetermined distance apart, said light control optics controlling the illumination of said interleaved photographic images such that an autostereoscopic or dynamic image is displayed.

16. A light control material according to claim 15 wherein said layer of emulsion is a layer of print type emulsion.

17. A light control material according to claim 15 wherein said layer of emulsion is a layer of instant film.

18. A light control material according to claim 15 wherein said light control optics operate in a transmissive mode and wherein said dark zones are covered with a reflective layer of metal, thereby providing illumination of said interleaved photographic images.

19. A light control material according to claim 15 wherein said light control optics operate in a reflective mode.

20. A light control material according to claim 15 wherein said dark zones are constituted by light absorbing structures and wherein at least said dark zones are covered with a reflective layer of metal.

21. A light control material according to claim 15 wherein said light control optics are comprised of cured photopolymer.

22. A light control material according to claim 15 wherein said three-dimensional image has a field of view which can be altered by varying said predetermined distance.

23. A light control material according to claim 15 wherein said three-dimensional image has a field of view which can be altered by varying said width.

24. A method for creating a light control material for displaying an autostereoscopic image, said method comprising the steps of:

generating light control optics comprising a pattern of bright zones and dark zones;

embossing said light control optics onto a first surface of a transparent substrate;

covering a second surface of said transparent substrate with a layer of emulsion, said second surface being opposite and parallel to said first surface;

exposing said emulsion to a plurality of images and developing said emulsion such that interleaved image strips are produced in said emulsion.

25. A method for creating a light control material for displaying an autostereoscopic image according to claim 24 wherein the step of generating said light control optics includes creating a light control optics master and generating an embossment from said master, said embossment constituting said light control optics.

26. A method for creating a light control material for displaying an autostereoscopic image according to claim 25 wherein said embossment is generated from said master by a soft embossing process.

27. A method for creating a light control material for displaying an autostereoscopic image according to claim 26 wherein the step of exposing said emulsion is accomplished by projecting a plurality of images simultaneously onto said emulsion through a lenticular screen, wherein said images are projected onto said emulsion from particular positions with respect to said emulsion and with respect to said lenticular screen and wherein said lenticular screen has focusing characteristics, and wherein the focusing characteristics in conjunction with the particular positions of exposure cause interleaved image strips to be produced in said emulsion when said emulsion is developed.

28. A method for creating a light control material for displaying an autostereoscopic image according to claim 26 wherein the step of exposing said emulsion includes the steps of exposing first selected areas in said emulsion to one of said plurality of images through a mask, masking said first selected areas in the emulsion such that they are protected from subsequent exposure, and exposing second selected areas in said emulsion to a different one of said plurality of images through said mask wherein said second selected areas do not include said first selected areas.

29. A light control material for displaying autostereoscopic or dynamic images formed of a series of image elements, said light control material comprising:

a plurality of focusing elements; and light control optics having dark zones and bright zones, said dark zones and bright zones arranged in a predetermined pattern, and wherein there are a plurality of focusing elements associated with each image element of the series of image elements, and wherein said dark zones and bright zones cause light to be directed through all of the focusing elements associate with a particular image element in the same direction such that an autostereoscopic or dynamic image is provided, and wherein there are a plurality of said bright zones for each of said focusing elements and wherein each of said bright zones is separated by at least one of said dark zones.

30. A light control material as described in claim 29, wherein the bright zones are comprised of a light transmissive material.

31. A light control material as described in claim 29, wherein the light control optics further include a reflective layer for reflecting light at the bright zones.

32. A light control material as described in claim 29, wherein the light control optics comprise a substrate and an opaque material on the substrate for forming the dark zones.

33. A light control material as described in claim 32, wherein the substrate is comprised of a reflective layer and the opaque material covers selected portions of the reflective layer thereby forming the bright zones at those portions of the reflective layer not covered by the opaque material.

34. A light control material as described in claim 32, wherein a defractive, holographic or diffusing pattern is applied to the bright zones.

35. A light control material as described in claim 32, Wherein the opaque material is selected from the group consisting of pigmented ink, a light absorbing optical structure or a light dispersing optical structure.

36. A light control material as described in claim 29, wherein the light control optics comprise a substrate and wherein the substrate is comprised of an opaque material.

37. A light control material as described in claim 29, wherein the focusing optics are selected from the group consisting of refractive optics, diffractive optics and mixed refractive and diffractive optics.

* * * * *